(12) United States Patent
Lau et al.

(10) Patent No.: US 7,087,500 B2
(45) Date of Patent: Aug. 8, 2006

(54) CHARGE TRAPPING MEMORY CELL

(75) Inventors: Frank Lau, Bad Aibling (DE); Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 29 days.

(21) Appl. No.: 10/894,348

(22) Filed: Jul. 19, 2004

(65) Prior Publication Data
US 2005/0045963 A1   Mar. 3, 2005

(30) Foreign Application Priority Data
Jul. 23, 2003   (DE)   ................... 103 33 549

(51) Int. Cl.
*H01L 21/76* (2006.01)
(52) U.S. Cl. .............. 438/423; 438/424; 257/315; 257/326
(58) Field of Classification Search ............... 438/423
See application file for complete search history.

(56) References Cited

U.S. PATENT DOCUMENTS

| | | |
|---|---|---|
| 5,889,304 A | 3/1999 | Watanabe et al. |
| 6,194,285 B1 * | 2/2001 | Lin et al. ................ 438/424 |
| 6,781,193 B1 * | 8/2004 | Lee et al. ................ 257/326 |
| 6,806,163 B1 * | 10/2004 | Wu et al. ................. 438/423 |
| 2002/0024092 A1 | 2/2002 | Palm et al. |
| 2003/0015752 A1 | 1/2003 | Palm et al. |
| 2003/0111687 A1 | 6/2003 | Willer et al. |

FOREIGN PATENT DOCUMENTS

| | | |
|---|---|---|
| DE | 100 39 441 A1 | 2/2002 |
| DE | 101 62 261 A1 | 7/2003 |
| JP | 08-088285 | 4/1996 |

OTHER PUBLICATIONS

Park, et al., "Fabrication of Body-Tied FinFETs (Omega MOSFETs) Using Bulk Si Wafers," 2003 Symposium on VLSI Technology Digest of Technical Papers, Jun. 10-12, 2003, pp. 135-136.

* cited by examiner

*Primary Examiner*—David Nelms
*Assistant Examiner*—Dao H. Nguyen
(74) *Attorney, Agent, or Firm*—Slater & Matsil, L.L.P.

(57) ABSTRACT

A memory cell includes a channel region between source/drain regions at the top side of a semiconductor body and is provided, transversely with respect to the longitudinal direction, with a bulge formed in the semiconductor material. This results in a uniform distribution of the strength of a radially directed electric field and avoids field strength spikes at lateral edges of the channel region. A storage layer sequence is situated between the channel region and the gate electrode as part of a word line.

14 Claims, 3 Drawing Sheets

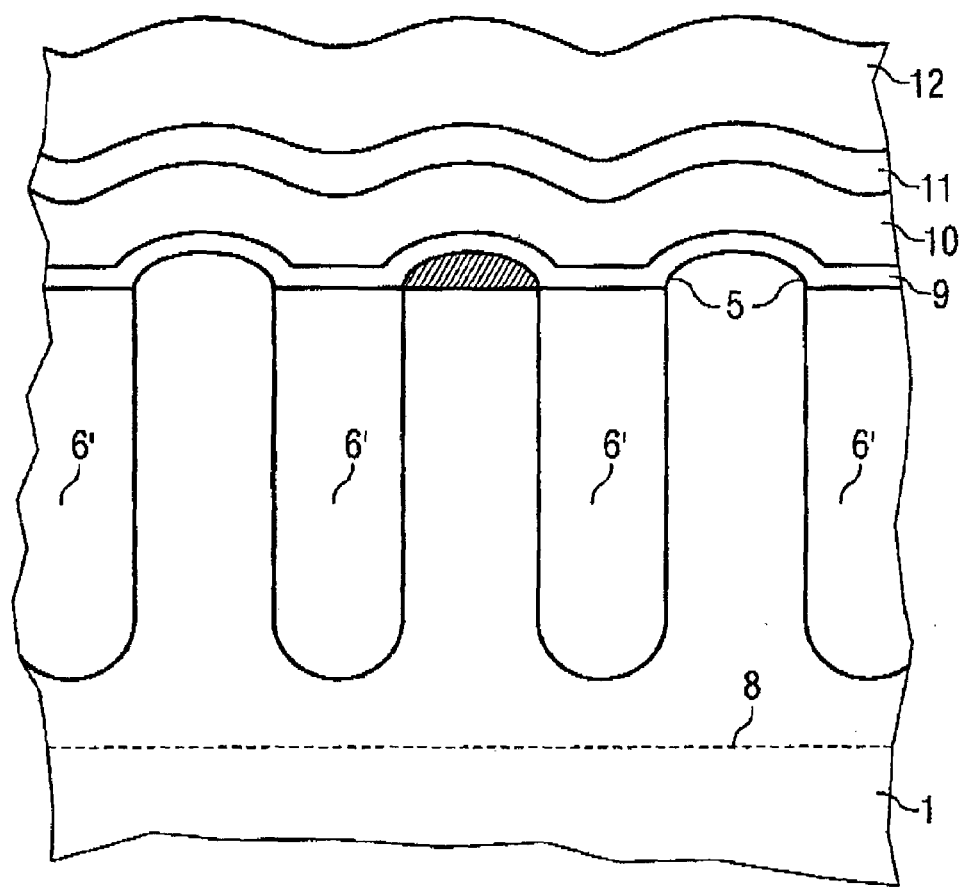
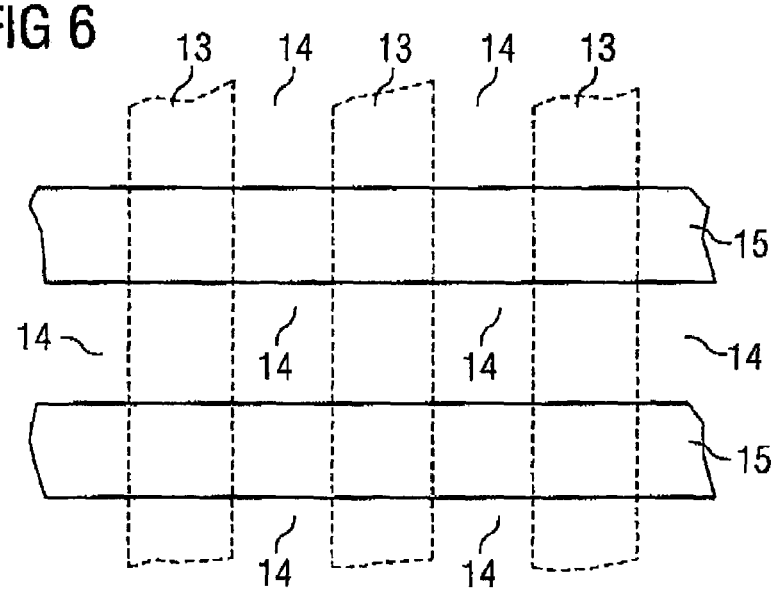

CHARGE TRAPPING MEMORY CELL

This application claims priority to German Patent Application 103 33 549.8, which was filed Jul. 23, 2003 and is incorporated herein by reference.

TECHNICAL FIELD

The present invention relates generally to memories, and more particularly to a charge trapping memory cell.

BACKGROUND

Memory transistors with a dielectric storage layer sequence are usually embodied as planar transistors or as trench transistors. The structure of these transistors therefore corresponds to the structure of standard NMOS transistors. In this case, the gate dielectric is replaced by a storage layer sequence comprising a storage layer between boundary layers, in which charge carriers from the channel are trapped during the programming of the memory cell. With this memory cell construction, the problem arises that, owing to the required data retention (retention time) and sufficiently high number of programming/erasure cycles, the thicknesses of the dielectric layers are relatively large compared with the gate oxide of conventional transistors. By way of example, use is made of storage layer sequences comprising a channel-side bottom oxide having a typical thickness of 6 nm, a silicon nitride storage layer having a thickness of typically 6 nm and a top oxide on the side of the gate electrode having a thickness of typically 12 nm. The disadvantages of such a thick gate dielectric are a poor gate control, associated with a poor slope of the control curve, a high threshold voltage and an unfavorable scalability.

The publication by T. Park et al.: "Fabrication of Body-Tied FinFETs (Omega MOSFETS) Using Bulk Si Wafers", 2003 Symposium on VLSI Technology Digest of Technical Papers (June 2003), describes DRAM cell transistors in which the channel is present in a rib active region which is spanned in bridge-like fashion or encompassed in pincers-like fashion by the gate electrode. The upper portion of the channel region is rounded due to the dictates of fabrication, which is regarded as an advantage owing to the resultant suppression of undesirable leakage currents along the essentially planar side channels.

SUMMARY OF THE INVENTION

In one aspect, the present invention provides an improved charge trapping memory cell which affords a sufficiently good gate control even in the case of embodiments in the sub-hundred nm range.

The charge trapping memory cell of the preferred embodiment is based on the insight that the known phenomenon of a corner device occurs with a distinct elevation of the electric field at the lateral margins of the transistor channel. This is because the memory cell is delimited there by insulation regions for which reason edges are present at the margins of the active regions formed by the semiconductor material. The semiconductor material is doped there, albeit only in the low dopant concentration of typically $10^{17}$ cm$^{-3}$ as is customary for well regions, and is therefore conductive. The electric field is thus essentially perpendicular to the conductor surface, so that a very high field strength occurs at the edges of the semiconductor material.

According to preferred embodiment of the invention, the charge trapping memory cell is formed such that a largely homogeneous distribution of the magnitude of the electric field is present in the channel region. This is achieved by virtue of the fact that the top side of the channel region, which faces the gate electrode, is bulged in the direction transversely with respect to the longitudinal direction of the channel (that is to say transversely with respect to the connection between the source and drain regions) and in this case preferably assumes the form of an outer surface of a semicylinder. The largely uniform curvature results in a homogenization of the electric field, which is directed radially everywhere with respect to the cylinder form and preferably has at least approximately the same magnitude everywhere.

Significantly improved transistor properties result as a consequence of the electrostatic properties of this cylinder symmetry of the channel region. It has been demonstrated that, given otherwise identical parameters, the maximum electron concentration in the channel in the case of the cylindrically bulged channel top side is almost twice as high as in the planar case. In other words, a distinctly flatter channel is present. In this case, the gate voltage was assumed to be 9 volts, and the source voltage 0 volts. The width of the active transistor region between the insulating boundaries, i.e. the channel width, was assumed to be 120 nm, and the doping of the well region was assumed to be $2 \times 10^{17}$ cm$^{-3}$. In the case of programming by means of hot electrons (CHE, channel hot electrons), the programming voltage can be decreased from typically 9 volts in the case of planar channel regions to approximately 6 volts in the case of the cylindrically symmetrical arrangement, given the same electron concentration in the channel.

The charge trapping memory cell according to the preferred embodiment makes it possible to further reduce the dimensions of the memory cell in conjunction with improved gate control. In this case, the gate control is no longer determined by the electrostatic properties of a planar capacitor with corresponding fields in the planar dielectric (i.e., constant field strength), but rather by the properties of a cylindrical capacitor with radially symmetrical field dependence.

BRIEF DESCRIPTION OF THE DRAWINGS

Examples of the charge trapping memory cell will be described in more detail below with reference to FIGS. 1 to 6 which provide:

FIG. 5 shows the cross section of FIG. 4 after the application of a layer sequence provided for word lines; and FIG. 6 shows the arrangement of the isolation trenches and word lines schematically in plan view.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
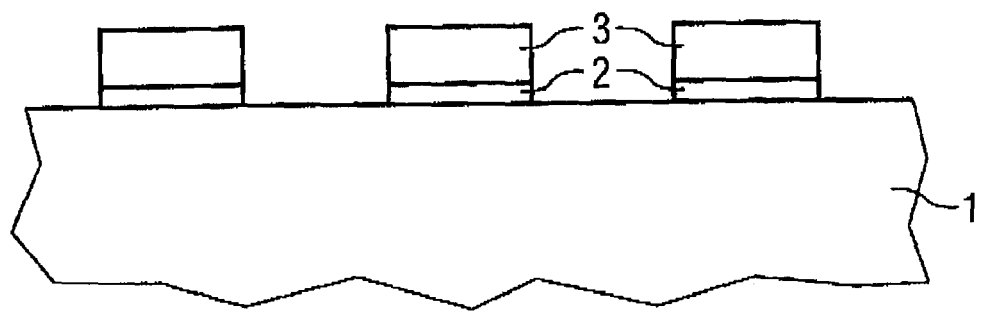
FIG. 1 shows an intermediate product of the fabrication of the memory cell after the patterning of pad oxide and pad nitride.

The structure of the charge trapping memory cell is described below with reference to a preferred fabrication method. FIG. 1 shows a cross section through a semiconductor body 1 or a substrate made of semiconductor material. A thin layer is applied as a pad oxide to an essentially planar top side in a conventional manner, and a layer is applied as a pad nitride to said thin layer. These layers are patterned by means of a suitable mask technique (lithography) such that the pad oxide 2 and the pad nitride 3 are removed in the region where STI isolations (shallow trench isolations) will be fabricated. The STI isolations are provided for insulating series of memory cells of a memory cell array from one another. The patterning of pad oxide 2 and pad nitride 3 is effected for example by means of RIE (reactive ion etching). The etching step is preferably performed such that the uncovered semiconductor material of the semiconductor body 1 is etched using the same mask, so that trenches are formed in the semiconductor material.

Figure 2:
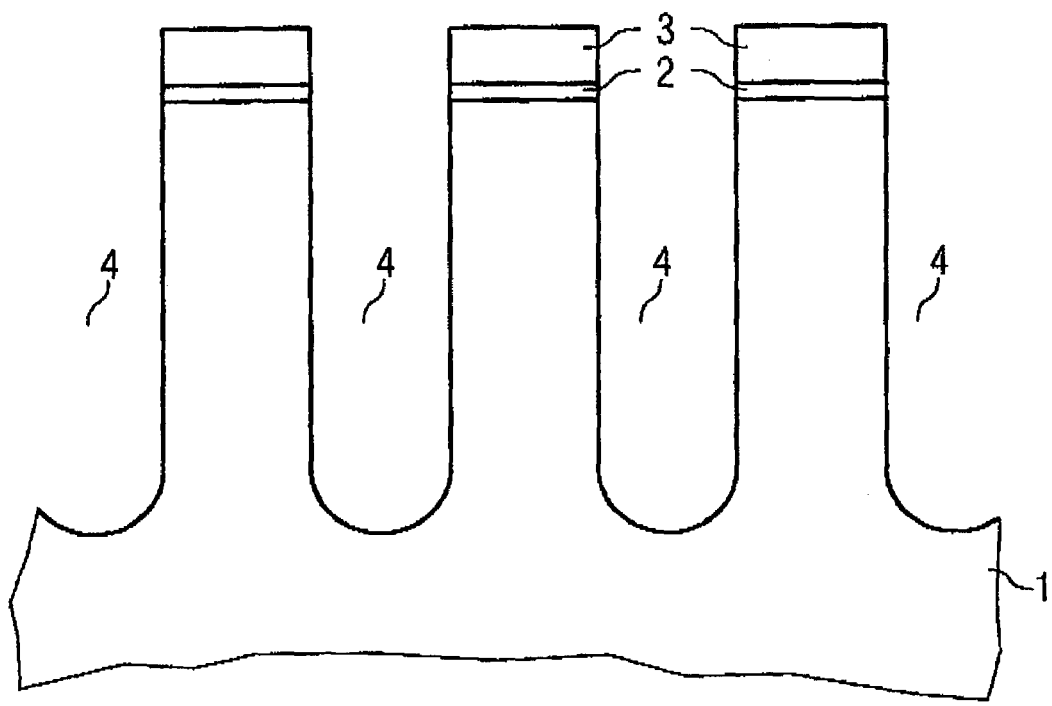
FIG. 2 shows the cross section in accordance with FIG. 1 after the etching of isolation trenches.

FIG. 2 shows the cross section in accordance with FIG. 1, after the trenches 4 have been etched into the semiconductor material in the regions in which the pad oxide 2 and the pad nitride 3 were removed. FIG. 2 illustrates the cross section transversely with respect to the longitudinal direction of the trenches. The trenches thus run perpendicularly to the plane of the drawing with an at least approximately uniform cross section. A further etching step follows as pull-back, by means of which the residual strip-like portions of the pad nitride 3 are etched back laterally and the nitride strips are thus narrowed. Although this pull-back etch is not absolutely necessary, it makes a significant contribution to the desired rounding of the edges of the semiconductor material in subsequent fabrication steps. Therefore, it is particularly preferred.

Afterward, a thermal oxide is grown on as a liner in a manner known per se. This involves a thin oxide layer (not explicitly shown), which covers the semiconductor material 1 at the top side. The dimensions of the rounding of the edges of the semiconductor material can likewise be influenced by the thickness of the layer made of thermal oxide and the process control during the fabrication thereof. The trenches are then filled with oxide 6, which is removed in planarizing fashion on the top side as far as the top side of the pad nitride 3. This may be effected e.g. by means of CMP (chemical mechanical polishing).

Figure 3:
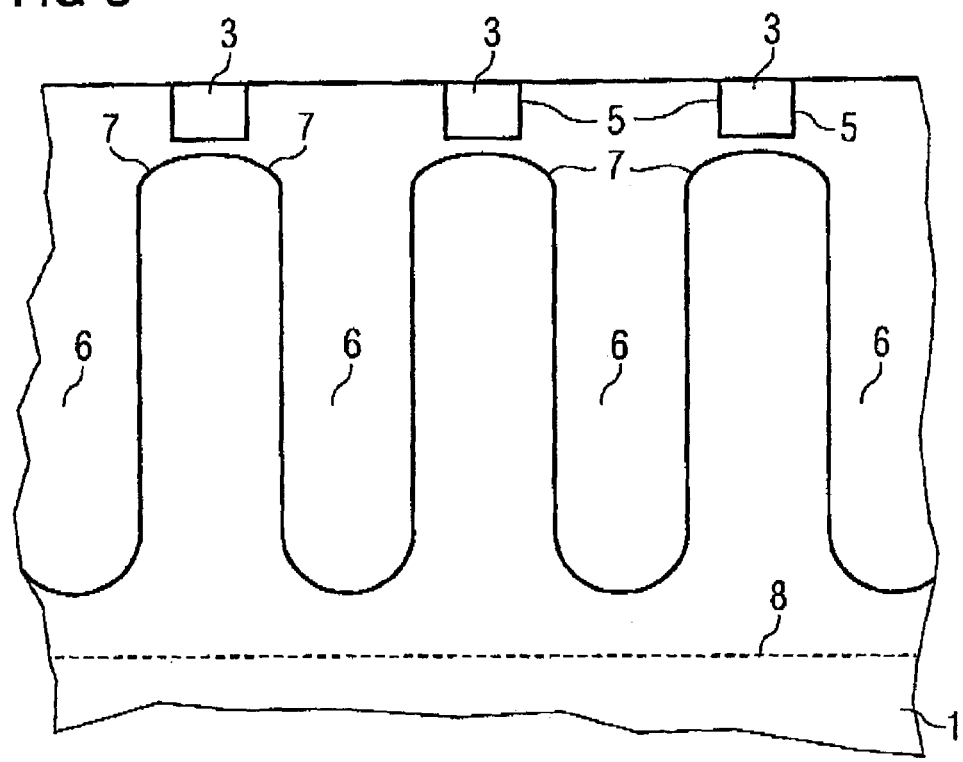
FIG. 3 shows the cross section of FIG. 2 after an oxide filling of the trenches.

FIG. 3 shows the cross section corresponding to FIG. 2 after these method steps. It can be seen in FIG. 3 that the residual strip-type portions of the pad nitride 3 have been laterally etched back somewhat as a result of the pull-back etching step. Therefore, the sidewalls 5 of the strip-type portions of the pad nitride 3 are situated such that they are set back somewhat with respect to the walls of the trenches (labeled 4 in FIG. 2) in the direction of the semiconductor material webs present between the latter. The pull-back etching step and the fabrication of the liner made of thermal oxide have resulted in the formation of the bulges 7 at the edges of the semiconductor webs. A lithography additionally ensues for implantation of dopant for the formation of the doped well 8. A selective etching of the nitride and a preferably wet-chemical etching-back of the oxide filling 6 yields the structure illustrated in FIG. 4, where reference numeral 6 denotes the residual oxide filling.

Figure 4:
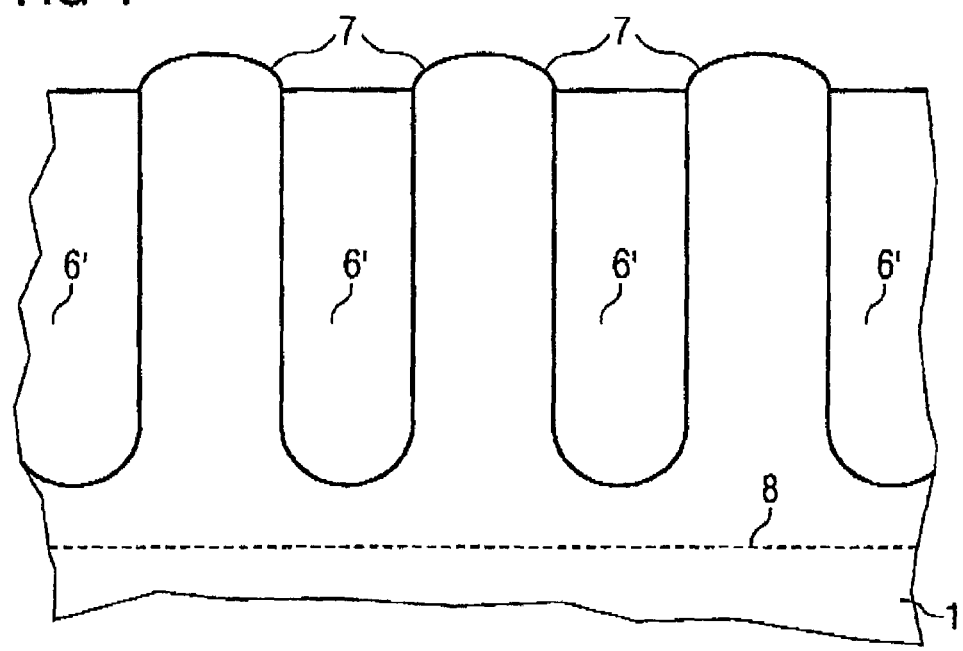
FIG. 4 shows the cross section of FIG. 3 after an etching-back of the oxide filling.

The top-side bulges of the webs made of semiconductor material are clearly discernable in FIG. 4. These bulges 7 form a top-side rounding which, by way of example, may have the form of the outer surface of a semicylinder. The bulges 7 are illustrated somewhat flatter, however, in FIG. 4 since what is desired is that no sharp edges are present at the lateral margins of the channel regions. The residual portions 6' of the oxide filling form the STI isolations between series of memory cells. The longitudinal directions of the channel regions run parallel to the STI isolations, i.e. perpendicularly to the plane of the drawing. Since the channels of the memory transistors are formed directly below the top side of the semiconductor material, the channel regions are bulged owing to the bulges 7 present in the transverse direction and are thus widened with respect to a planar channel region present in the plane formed by the top side of the semiconductor body 1 or substrate, so that the channel width is correspondingly larger. If appropriate, therefore, the lateral dimensions of the semiconductor webs may be correspondingly reduced and the lateral dimensions of the memory cells may thus also be reduced.

For the purpose of a clear demarcation of the exemplary embodiments of the charge trapping memory cell relative to the prior art, it may be assumed, as a lower limit for the dimensioning of the bulge 7, that it comprises at least two thirds of the channel width. In this case, the channel width is measured at the curved top side of the semiconductor material, to be precise over the region which is controlled by the gate electrode that is to be applied later. This region ends at the top side of the portions 6' of the oxide filling. It suffices if the top side of the channel region is sufficiently uniformly curved only in regions and is formed in planar fashion at most up to a third of the channel width, preferably in a central region of the channel, and coincides there with the plane of the top side of the semiconductor body 1. In this case, a plane touching the semiconductor material on the top side may be interpreted as a plane determined by the top side. In preferred exemplary embodiments, the bulge 7 may be assumed to be at least so greatly pronounced that a maximum difference in height of two points at the top side of the channel region with respect to a plane determined by the top side of the semiconductor body 1 or substrate, measured in a direction perpendicular to said plane, amounts to at least one third of the dimensioning of a projection of the top side of the channel region into said plane.

This may be illustrated on the basis of that region of the cross section which is depicted in dashed fashion in FIG. 5. The upper rounded boundary of this dashed region forms the top side of the channel region. A projection of this top side of the channel region in a direction perpendicular to the plane of the top side of the semiconductor body images the top side of the channel region onto the lower boundary of the region depicted in dashed fashion in FIG. 5. Therefore, in preferred exemplary embodiments, the maximum perpendicular dimension of the hatched region amounts to at least one third of the lower boundary section of the hatched region. The bulge 7 is thus great enough to bring about a sufficiently homogeneous distribution of the strength of the electric field. The magnitude and direction of the electric field strength occurring in the channel region change sufficiently weakly over the channel width to avoid the phenomena of the corner device explained in the introduction.

A storage layer sequence 9 may then be deposited onto the top side, this forming the storage medium of the memory cell. The storage layer sequence 9 comprises an actual storage layer between boundary layers. The boundary layers are for example an oxide of the semiconductor material, for example silicon dioxide. Silicon nitride, tantalum oxide, hafnium silicate, titanium oxide, zirconium oxide, aluminum oxide, intrinsically conducting silicon or germanium are taken into consideration for the storage layer. The storage layer sequence may be formed in particular in the manner of the ONO layer of a SONOS memory cell.

Afterward, the layers provided for the word lines, which also form respective gate electrodes, are deposited. They are for example a polysilicon layer 10, a tungsten silicide layer 11 and a nitride layer 12 which is patterned to form the hard mask and with the aid of which the polysilicon layer 10 and the tungsten silicide layer 11 are patterned to form strip-type word lines arranged parallel at a distance with respect to one another. In this exemplary embodiment, the word lines run transversely with respect to the longitudinal directions of the STI isolations.

Dopant is then implanted, likewise using the hard mask layer formed by the nitride layer 12, in order to fabricate the source/drain regions in a self-aligned manner. Spacers made of dielectric material may additionally be provided at the sidewalls of the word lines, in order to be able to better set the distance between the gate electrodes and the source/drain regions and thus to be able to better predetermine the transistor properties. Process steps then follow for making contact with the source/drain regions and connecting the gate electrodes. Such process steps are known per se from the fabrication of semiconductor memories.

FIG. 6 illustrates a plan view of the scheme of the STI isolations 13, the word lines 15 and the source/drain regions 14 formed in a self-aligned manner with respect thereto.

Although the present invention and its advantages have been described in detail, it should be understood that various changes, substitutions and alterations can be made herein without departing from the spirit and scope of the invention as defined by the appended claims.

What is claimed is:

1. A method of forming an array of memory cells, the method comprising:
    forming a masking layer over a top surface of a semiconductor body;
    patterning the masking layer to expose portions of the top surface that will serve as isolation regions for separating a plurality of remaining web portions of said semiconductor body, each of said web portions for forming the source regions, channel regions, and drain regions of transistors such that the longitudinal direction of the channel region extending between the source and drain runs parallel to a first direction and the channel width is transverse to said first direction;
    etching the semiconductor body to form trenches at the exposed portions of the top surface;
    narrowing remaining portions of the masking layer;
    thermally growing an oxide layer over exposed portions of the semiconductor body to a selected thickness, said steps of narrowing and thermally growing operating to form a top side on said web portions extending between pairs of trenches, said top side defining the channel width, and said top side including a bulge or curved portion;
    filling the trenches with an insulating material to form the isolation regions;
    depositing a storage layer sequence over the semiconductor body between the isolation regions;
    depositing a conductive layer over the storage layer sequence; and
    patterning the storage layer sequence and the conductive layer.

2. The method of claim 1 wherein forming a masking layer comprises forming a nitride layer.

3. The method of claim 1 wherein filling the trenches comprises depositing an insulating material and then planarizing a top surface of the insulating layer.

4. The method of claim 3 wherein filling the trenches comprises filling the trenches with an oxide.

5. The method of claim 1 wherein depositing a storage layer sequence comprises: depositing first boundary layer; depositing a storage layer; and depositing a second boundary layer.

6. The method of claim 5 wherein the first and second boundary layers comprise oxide and wherein the storage layer comprises at least one material selected from the group consisting of silicon nitride, tantalum oxide, hafnium silicate, titanium oxide, zirconium oxide, aluminum oxide, intrinsically conducting silicon and germanium.

7. The method of claim 1 wherein depositing a storage layer sequence comprises depositing an ONO (oxide nitride oxide) sequence of layers.

8. The method of claim 1 wherein depositing a conductive layer comprises forming a polysilicon layer and an overlying silicide layer.

9. The method of claim 1 wherein patterning the conductive layer and the storage layer sequence comprises forming strip-like word lines arranged parallel from one another.

10. The method of claim 9 and further comprising: forming spacers of a dielectric material at sidewalls of the wordlines; and doping portions of the semiconductor body adjacent the spacers to form source/drain regions.

11. The method of claim 1 and further comprising doping portions of the semiconductor body after the patterning step.

12. The method of claim 1 wherein said bulge or curved section comprises at least one third of said channel width.

13. A method of forming an array of memory cells, the method comprising:
    forming a masking layer over a top surface of a semiconductor body;
    patterning the masking layer to cover a plurality of web portions of semiconductor material extending in a first direction for forming the source and drain regions and the channel region of at least one transistor having a width extending transverse to said first direction, and to expose portions of the top surface extending in said first direction that will serve as isolation regions;
    etching the semiconductor body to form trenches at the exposed portions of the top surface, such that individual ones of said plurality of web portions are separated by a pair of adjacent trenches;
    narrowing remaining portions of the masking layer;
    thermally growing an oxide layer to a selected thickness over exposed portions of the semiconductor body, said steps of narrowing and thermally growing to a selected thickness operating to form a top side on said web portions extending between pairs of trenches, said top side defining the channel width of said at least one transistor extending between said pair of adjacent trenches, and said formed top side including a bulge or curved portion;
    filling the trenches with an insulating material to form the isolation regions;
    depositing a storage layer sequence over the semiconductor body between the isolation regions;
    depositing a conductive layer over the storage layer sequence; and
    patterning the storage layer sequence and the conductive layer.

14. The method of claim 13 wherein said bulge or curved section comprises at least one third of said channel width.

* * * * *